(12) United States Patent
Drucker et al.

(10) Patent No.: US 8,112,655 B2
(45) Date of Patent: Feb. 7, 2012

(54) MESOSYNCHRONOUS DATA BUS APPARATUS AND METHOD OF DATA TRANSMISSION

(75) Inventors: Kevin D. Drucker, Granite Bay, CA (US); James H. Jones, Granger, TX (US); Jon C. R. Bennett, Sudbury, MA (US)

(73) Assignee: Violin Memory, Inc., Iselin, NJ (US)

( * ) Notice: Subject to any disclaimer, the term of this patent is extended or adjusted under 35 U.S.C. 154(b) by 456 days.

(21) Appl. No.: 12/245,349

(22) Filed: Oct. 3, 2008

(65) Prior Publication Data

US 2009/0150707 A1 Jun. 11, 2009

Related U.S. Application Data

(63) Continuation-in-part of application No. 11/405,083, filed on Apr. 17, 2006.

(60) Provisional application No. 60/997,899, filed on Oct. 5, 2007, provisional application No. 60/674,189, filed on Apr. 21, 2005, provisional application No. 60/698,626, filed on Jul. 11, 2005.

(51) Int. Cl.
 *G06F 1/00* (2006.01)
 *G06F 1/12* (2006.01)
(52) U.S. Cl. ........ 713/500; 713/400; 713/401; 713/503; 714/700; 375/354; 375/355
(58) Field of Classification Search .................. 713/400, 713/401, 500, 503; 714/700; 375/354, 355
 See application file for complete search history.

(56) References Cited

U.S. PATENT DOCUMENTS

| | | | |
|---|---|---|---|
| 3,728,679 A | 4/1973 | McIntosh | |
| 3,970,798 A | 7/1976 | Epenoy et al. | |
| 4,128,882 A | 12/1978 | Dennis | |
| 4,240,143 A | 12/1980 | Besemer et al. | |
| 4,263,651 A | 4/1981 | Donath | |

(Continued)

FOREIGN PATENT DOCUMENTS

WO  WO 99/30240  6/1999

(Continued)

OTHER PUBLICATIONS

Written Opinion of the International Searching Authority from the International Search Report from PCT application No. PCT/US2008/074628 dated Mar. 24, 2009, 5 pages.

(Continued)

*Primary Examiner* — Brian Misiura
(74) *Attorney, Agent, or Firm* — Brinks Hofer Gilson & Lione

(57) ABSTRACT

A memory system is described, where the transmission time of data between memory modules is managed so that the overall time delay between specified points in the memory system is maintained a constant. Each lane of a multilane bus may be separately managed, and a data frame evaluated at the destination module, without a need for deskewing at intermediate modules. The time delay in propagation of the data through a module, which may have a switch to route the data, is reduced by operating the data path through the module at one or more submultiples of the bus serial data rate, and selecting the sampling point of the received data so that variations in time delay due to temperature changes or ageing are accommodated.

20 Claims, 9 Drawing Sheets

U.S. PATENT DOCUMENTS

| | | | |
|---|---|---|---|
| 4,322,849 A | 3/1982 | Calabrese | |
| 4,323,849 A | 4/1982 | Smith | |
| 4,363,094 A | 12/1982 | Kaul | |
| 4,383,314 A | 5/1983 | Tam | |
| 4,386,323 A | 5/1983 | Jansen | |
| 4,543,630 A | 9/1985 | Neches | |
| 4,558,455 A | 12/1985 | Epenoy et al. | |
| 4,701,756 A | 10/1987 | Burr | |
| 4,703,451 A | 10/1987 | Calabrese | |
| 4,756,011 A | 7/1988 | Cordell | |
| 4,805,195 A | 2/1989 | Keegan | |
| 4,845,709 A | 7/1989 | Matsumoto et al. | |
| 4,860,201 A | 8/1989 | Stolfo et al. | |
| 4,881,165 A | 11/1989 | Sager et al. | |
| 4,910,669 A | 3/1990 | Gorin et al. | |
| 4,922,409 A | 5/1990 | Schoelkopf et al. | |
| 5,041,964 A | 8/1991 | Cole et al. | |
| 5,053,942 A | 10/1991 | Srini | |
| 5,200,746 A | 4/1993 | Yoshifuji | |
| 5,283,877 A | 2/1994 | Gastinel | |
| 5,285,441 A | 2/1994 | Bansal | |
| 5,313,501 A | 5/1994 | Thacker | |
| 5,467,040 A | 11/1995 | Nelson et al. | |
| 5,507,029 A | 4/1996 | Granato | |
| 5,513,377 A | 4/1996 | Capowski | |
| 5,621,774 A | 4/1997 | Ishibashi | |
| 5,652,530 A * | 7/1997 | Ashuri | 326/93 |
| 5,828,253 A | 10/1998 | Murayama | |
| 5,832,286 A | 11/1998 | Yoshida | |
| 5,872,959 A | 2/1999 | Nguyen | |
| 5,920,704 A | 7/1999 | Olnowich | |
| 5,923,830 A | 7/1999 | Fuchs et al. | |
| 5,960,034 A | 9/1999 | Lo | |
| 6,031,847 A | 2/2000 | Collins | |
| 6,105,144 A | 8/2000 | Wu | |
| 6,138,185 A | 10/2000 | Nelson | |
| 6,157,229 A | 12/2000 | Yoshikawa | |
| 6,185,654 B1 | 2/2001 | Van Doren | |
| 6,208,667 B1 | 3/2001 | Caldara | |
| 6,260,151 B1 | 7/2001 | Omizo | |
| 6,301,167 B1 | 10/2001 | Lee | |
| 6,301,244 B1 | 10/2001 | Huang | |
| 6,310,814 B1 | 10/2001 | Hampel | |
| 6,317,352 B1 | 11/2001 | Halbert et al. | |
| 6,335,647 B1 | 1/2002 | Nagano | |
| 6,335,930 B1 | 1/2002 | Lee | |
| 6,345,321 B1 | 2/2002 | Litaize et al. | |
| 6,356,610 B1 | 3/2002 | Ott | |
| 6,359,815 B1 | 3/2002 | Sato | |
| 6,369,605 B1 | 4/2002 | Bonella et al. | |
| 6,370,200 B1 | 4/2002 | Takahashi | |
| 6,378,018 B1 | 4/2002 | Tsern | |
| 6,417,713 B1 | 7/2002 | DeRyckere | |
| 6,425,114 B1 | 7/2002 | Chan | |
| 6,442,644 B1 | 8/2002 | Gustavson et al. | |
| 6,445,719 B1 | 9/2002 | Schneider et al. | |
| 6,446,174 B1 | 9/2002 | Dow | |
| 6,449,667 B1 | 9/2002 | Ganmukhi et al. | |
| 6,473,439 B1 * | 10/2002 | Zerbe et al. | 370/503 |
| 6,473,827 B2 | 10/2002 | McMillen | |
| 6,493,205 B2 | 12/2002 | Bauer | |
| 6,493,250 B2 | 12/2002 | Halbert et al. | |
| 6,502,161 B1 | 12/2002 | Perego et al. | |
| 6,553,450 B1 | 4/2003 | Dodd et al. | |
| 6,557,110 B2 | 4/2003 | Sakamoto | |
| 6,601,178 B1 | 7/2003 | Gulik | |
| 6,611,518 B1 | 8/2003 | Ngo | |
| 6,618,791 B1 | 9/2003 | Dodd | |
| 6,625,687 B1 | 9/2003 | Halbert et al. | |
| 6,636,932 B1 | 10/2003 | Regev | |
| 6,636,993 B1 | 10/2003 | Koyanagi | |
| 6,647,027 B1 | 11/2003 | Gasparik | |
| 6,658,509 B1 | 12/2003 | Bonella et al. | |
| 6,678,783 B2 | 1/2004 | Ozawa | |
| 6,681,338 B1 | 1/2004 | Kollipara | |
| 6,697,974 B2 | 2/2004 | Craft | |
| 6,735,397 B2 | 5/2004 | Herrity | |
| 6,799,235 B2 | 9/2004 | Bormann et al. | |
| 6,803,872 B2 | 10/2004 | DeRyckere | |
| 6,807,377 B1 | 10/2004 | Watanabe | |
| 6,833,618 B2 | 12/2004 | Ono et al. | |
| 6,845,461 B1 | 1/2005 | Kim | |
| 6,871,253 B2 | 3/2005 | Greef et al. | |
| 6,874,097 B1 | 3/2005 | Aliahmad | |
| 6,882,082 B2 | 4/2005 | Greef et al. | |
| 6,904,050 B2 | 6/2005 | Chao | |
| 6,928,571 B1 | 8/2005 | Bonella et al. | |
| 6,937,681 B2 | 8/2005 | Watanabe | |
| 6,961,347 B1 | 11/2005 | Bunton et al. | |
| 6,968,419 B1 | 11/2005 | Holman | |
| 6,983,354 B2 | 1/2006 | Jeddeloh | |
| 7,012,811 B1 | 3/2006 | Jiang et al. | |
| 7,013,361 B2 | 3/2006 | Liron | |
| 7,065,101 B2 * | 6/2006 | Ziegler et al. | 370/467 |
| 7,085,950 B2 | 8/2006 | Ehmann | |
| 7,113,012 B2 | 9/2006 | Amin | |
| 7,123,660 B2 | 10/2006 | Haq | |
| 7,130,317 B2 | 10/2006 | Annadurai | |
| 7,139,347 B2 | 11/2006 | Fujita | |
| 7,164,615 B2 | 1/2007 | Park | |
| 7,193,429 B2 | 3/2007 | Okuyama | |
| 7,200,790 B2 * | 4/2007 | Sharma et al. | 714/749 |
| 7,205,803 B2 | 4/2007 | Chung | |
| 7,280,538 B2 | 10/2007 | Li | |
| 7,304,520 B2 | 12/2007 | Cho | |
| 7,328,362 B2 | 2/2008 | Chiang | |
| 7,430,728 B1 | 9/2008 | Rahut | |
| 7,433,441 B2 | 10/2008 | Jenkins | |
| 7,490,189 B2 | 2/2009 | Eberle | |
| 7,516,029 B2 * | 4/2009 | Kim et al. | 702/69 |
| 7,525,356 B2 | 4/2009 | Hui | |
| 7,551,640 B1 * | 6/2009 | Klecka et al. | 370/465 |
| 7,609,695 B2 | 10/2009 | Zhu | |
| 7,643,517 B2 | 1/2010 | Annadurai | |
| 7,653,776 B2 | 1/2010 | Cornelius | |
| 7,668,271 B2 * | 2/2010 | Kim et al. | 375/354 |
| 7,668,272 B1 * | 2/2010 | Obeidat | 375/354 |
| 7,734,867 B1 | 6/2010 | Keeton | |
| 7,751,713 B2 | 7/2010 | Perkins | |
| 7,817,767 B2 * | 10/2010 | Tell et al. | 375/376 |
| 2001/0039601 A1 | 11/2001 | Leung | |
| 2002/0009169 A1 | 1/2002 | Watanabe | |
| 2002/0084458 A1 | 7/2002 | Halbert et al. | |
| 2002/0112119 A1 | 8/2002 | Halbert et al. | |
| 2002/0124153 A1 | 9/2002 | Litaize et al. | |
| 2003/0018880 A1 | 1/2003 | Litaize et al. | |
| 2003/0058021 A1 | 3/2003 | Lee et al. | |
| 2003/0061447 A1 | 3/2003 | Perego et al. | |
| 2003/0091039 A1 | 5/2003 | Ziegler | |
| 2003/0117172 A1 | 6/2003 | Wu et al. | |
| 2003/0120895 A1 | 6/2003 | Litaize et al. | |
| 2003/0126485 A1 | 7/2003 | Wilcox | |
| 2003/0163606 A1 | 8/2003 | Fukaishi | |
| 2003/0193927 A1 | 10/2003 | Hronik | |
| 2003/0206164 A1 | 11/2003 | Juenger | |
| 2003/0208511 A1 | 11/2003 | Earl et al. | |
| 2003/0236939 A1 | 12/2003 | Kleveland et al. | |
| 2004/0004897 A1 | 1/2004 | Kang | |
| 2004/0117569 A1 | 6/2004 | Kyung | |
| 2004/0122985 A1 | 6/2004 | Parra et al. | |
| 2004/0230718 A1 | 11/2004 | Polzin et al. | |
| 2004/0243769 A1 | 12/2004 | Frame et al. | |
| 2004/0256638 A1 | 12/2004 | Perego et al. | |
| 2005/0005184 A1 | 1/2005 | Lindt | |
| 2005/0007805 A1 | 1/2005 | Ware et al. | |
| 2005/0010737 A1 | 1/2005 | Ware et al. | |
| 2005/0060483 A1 | 3/2005 | Azuma | |
| 2005/0071693 A1 | 3/2005 | Chun et al. | |
| 2005/0086549 A1 | 4/2005 | Solomon et al. | |
| 2005/0089037 A1 | 4/2005 | Kojima | |
| 2005/0190622 A1 | 9/2005 | Choi | |
| 2005/0246362 A1 | 11/2005 | Borland | |
| 2005/0259692 A1 * | 11/2005 | Zerbe | 370/503 |
| 2006/0026450 A1 | 2/2006 | Bounitch | |
| 2006/0089107 A1 | 4/2006 | Domino | |
| 2006/0253721 A1 | 11/2006 | Johnson | |
| 2007/0079219 A1 | 4/2007 | Nagai | |

| | | |
|---|---|---|
| 2007/0088754 A1 | 4/2007 | Brannon et al. |
| 2007/0124532 A1 | 5/2007 | Bennett |
| 2007/0162516 A1 | 7/2007 | Thiel et al. |
| 2008/0175586 A1 | 7/2008 | Perkins |
| 2008/0175589 A1 | 7/2008 | Perkins |
| 2008/0183953 A1 | 7/2008 | Flynn |
| 2009/0052892 A1 | 2/2009 | Perkins |
| 2009/0324220 A1 | 12/2009 | Perkins |

FOREIGN PATENT DOCUMENTS

| | | |
|---|---|---|
| WO | WO 99/41667 | 8/1999 |

OTHER PUBLICATIONS

International Search Report for International Application No. PCT/US2008/074628, dated Mar. 24, 2009, 3 pages.
Written Opinion of the International Searching Authority from the International Search Report from PCT application No. PCT/US2008/078752 dated Mar. 31, 2009, 5 pages.
International Search Report for International Application No. PCT/US2008/078752, dated Mar. 31, 2009, 3 pages.
Jul. 21, 2009 Non-Final Office Action, U.S. Appl. No. 11/405,083.
Response to Jul. 21, 2009 Non-Final Office Action, U.S. Appl. No. 11/405,083, filed in the PTO on Oct. 7, 2009.
Written Opinion of the International Searching Authority from the International Search Report from PCT application No. PCT/US2008/083969 dated Apr. 30, 2009, 5 pages.
International Search Report for International Application No. PCT/US2008/083969, dated Apr. 30, 2009, 3 pages.
"X-Tree: A Tree Structured Multi-Proce3ssor Computer Architecture", by Alvin M. Despain and David A. Patterson; University of California/Computer Science Division, Berkeley, CA, p. 144-151.
"Communication in X-Tree, a Modular Multiprocessor System", by C.H. Sequin, A.M.Despain, D.A. Patterson; University of California, Computer Science Division, Electrical Engineering & Computer Sciences; Berkeley, CA, p. 194-203; 1978.
"A High-Speed Channel Controller for the Chaos Router", by Robert Wille; p. 1-21; Dec. 8, 1992.
"The Alewife CMMU: Addressing the Multiprocessor Communications Gap", by J. Kubiatowicz, D. Chaiken, A. Agarwal; Massachusetts Institute of Technology, Laboratory for Computer Science, Cambridge, MA; p. 1-3.
"Performance Evaluation of Switch-Based Wormhole Networks", by Lionel M. Ni, Yadong Gui, Sherry Moore; 1045-9219/97—1997 IEEE; p. 462-474.
Hans-Peter Messer: "PC—Hardwarebuch" 1995, Addison-Wesley, Bonn XP002412835 pp. 31-36, pp. 580-583.
International Search Report from PCT application No. PCT/US2006/014527 dated Apr. 10, 2007 (7 pages).
Written Opinion of the International Searching Authority from the International Search Report from PCT application No. PCT/US2006/014527 dated Apr. 10, 2007 (9 pages).
International Search Report for International Application No. PCT/US2007/022316, dated Mar. 28, 2008, 3 pages.
Notification of the First Office Action dated Dec. 26, 2008 from the Patent Office of People's Republic of China for Chinese Patent Application No. 2006800130653, 7 pages.

Argument and Amendment filed on Mar. 21, 2011 in the Korean Intellectual Property Office (KIPO) for Korean Patent Application No. 10-2009-7008236, 9 pages.
Written Opinion of the International Searching Authority from the International Search Report from PCT application No. PCT US2006/014527 dated Apr. 10, 2007 (9 pages).
Despaux, O., "DDR SDRAM Controller Using Virtex-4 FPGA Devices", 2004 Xilinx, Inc., XAPP709 (v1.0) Sep. 10, 2004, pp. 1-9.
European Patent Office Communication from EPO application No. 07 861 460.9-2212 dated Mar. 23, 2010 (3 pages).
European Patent Office Communication from EPO application No. 07 861 460.9-2212 dated Oct. 15, 2010 (5 pages).
European Search Report from EPO application No. 08836238.92212/2201463 dated Sep. 14, 2010 (7 pages).
Feb. 23, 2010 Non-Final Office Action, U.S. Appl. No. 11/405,083 (19 pages).
Juonolainen, M. K., "Cand Scient Thesis", University of Oslo, Jan. 2, 1999, 129 pages.
May 19, 2010 Non-Final Office Action, U.S. Appl. No. 11/075,269, 19 pages.
May 28, 2010 Response to European Patent Office Communication from EPO application No. 07 861 460.9-2212 dated Mar. 23, 2010 (17 pages).
Notice of Preliminary Rejection dated Jan. 24, 2011 from the Korean Intellectual Property Office (KIPO) for Korean Patent Application No. 10-2009-7008236, 2 pages.
Pharris, B., "The SCALE DRAM Subsystem", Massachusetts Institute of Technology, May 2004, pp. 1-79.
Response to Feb. 23, 2010 Non-Final Office Action, U.S. Appl. No. 11/405,083, filed in the PTO on May 12, 2010 (30 pages).
Response to May 19, 2010 Non-Final Office Action, U.S. Appl. No. 11/975,269, filed in the PTO on Nov. 9, 2010, 7 pages.
Jun. 22, 2011 Final Office Action, U.S. Appl. No. 11/975,269 (14 pages).
Response to Jun. 22, 2011 Final Office Action, U.S. Appl. No. 11/975,269, filed in the PTO on Jun. 24, 2011, 7 pages.
Response to Jul. 21, 2010 Final Office Action for U.S. Appl. No. 11/405,083 filed Nov. 17, 2010, 16 pages.
Lee, Kim, Nam and Yoo; *Inter-Pin Scheme for 3.2-Gb/s/pin Parallel Interface*, Oct. 1, 2009; pp.45-48, Journal of Semiconductor Technology and Science, vol. 10, No. 1, Mar. 2010.
Hu, An and Yuan, Fei; *Inter-Signal Timing Skew Compensation of Parallel Links With Voltage-Mode Incremental Signaling*; 2008, pp. 1740-1743, IEEE 978-1-4244-1684-4/08.
Chakraborty et al; *Dynamic Thermal Clock Skew Compensation Using Tunable Delay Buffers*, pp. 162-167, ISLPED'06, Oct. 4-6, 2006, Tegernsee, Germany.
Korean Intellectual Property Office (KIPO) Notice of Preliminary Rejection in related Korean Patent Application 10-2010-7009902, dated Aug. 3, 2011 (16 pages including English translation).
Extended European Search Report in Application No. 11168486.6-2212, dated Sep. 20, 2011 (4 pages).
US 6,832,284, 12/2004, Perego et al. (withdrawn)

* cited by examiner

MESOSYNCHRONOUS DATA BUS APPARATUS AND METHOD OF DATA TRANSMISSION

This application claims the benefit of U.S. provisional application Ser. No. 60/997,899, filed Oct. 5, 2007, and is a continuation-in-part of U.S. Ser. No. 11/405,083, filed on Apr. 17, 2006, which claims priority to U.S. provisional application Ser. No. 60/698,626, filed on Jul. 11, 2005 and U.S. provisional application Ser. No. 60/674,189, filed on Apr. 21, 2005, each of which is incorporated by reference.

TECHNICAL FIELD

This application relates to the management of a distributed clock in a memory system.

BACKGROUND

In a computer system, the central processor (CPU) accesses program information and data that is stored in a memory system. There is a hierarchy of memory systems, in size, in speed and capacity that a computer systems architect selects during the design phase, which may comprise, for example, cache memory, main memory and secondary memory. Cache memory is typified by low latency, high bandwidth and high cost per bit, and may be integral to the CPU. Cache memory may be a semiconductor device and which may be, for example, SRAM (static random access memory). Main memory, which is also a semiconductor technology, and which is typically a form of DRAM (dynamic random access memory), is used for less frequently accessed data and program data. At present, personal computers may have up to about 4 GB of DRAM, while high end servers may have about 16 GB or more of DRAM. Strategies such as using a plurality of memory controllers and computer cores may provide access to larger amounts of such memory; however, many of the computer bus systems have practical upper limits due to propagation time, bus loading, power consumption and the like. Larger amounts of data may be stored on mass storage; for example, magnetic disks, where a single disk may contain a terabyte (TB) of memory, FLASH memory disks (sometimes called solid state drives—SSD), and clusters of disks may be used. The access time for data stored on magnetic disks is significantly longer than that for data stored in main memory.

Large amounts of DRAM or other memory such as FLASH may be provided in memory appliances such as that described in U.S. patent application Ser. No. 11/405,083, filed on Apr. 17, 2006. To the extent that large memory arrays have a latency approaching that of conventional main memory, such memory arrays may be considered as similar to main memory and provide rapid access to large amounts of data that would have otherwise been stored in mass storage, such as rotating disk media.

Data is moved between memories and other devices and the central processor on pathways known as buses, which may of various architectures, including parallel, serial, point-to-point, daisy chained, or multi-stub, as examples.

A data bus may be operated in a synchronous manner if the clock frequency for the transmission and reception of data is the same at all points in the system, and a known phase relationship exists between the data bits at each point where the data is to be sensed (e.g., received). However, considering the transmission of data in a parallel bus between two adjacent nodes, the phase relationship of the data bits in different lines changes, depending on the time-delay skew. In slow speed data transmission, and for short bus lengths, this may be tolerated, but in high speed data transmission, the data bits may be received in varying phase relationships to the system clock, and may be delayed by more than one clock interval, resulting in errors, or requiring de-skewing and phase alignment, typically at each memory node.

This problem may be mitigated by transmitting the clock and data on each of the lines, and recovering the clock for each channel at a node. This clock differs in time delay with respect to the system clock from line-to-line. Also, when the clock is transmitted along with the data, transmission of data, or at least an idle data pattern, may be required so as to maintain the synchronization of the clock for each line.

Alternatively, the data may be recovered at each node by accumulating the data for each line in a buffer, determining the time delay adjustment needed to compensate for the data skew, and reconstructing the data received at each node prior to acting on the data (where the word data is understood to include in-band commands such as read, write, and the like as well as information, which may include instructions, that is to be written to, or read from memory.) In order to make the skew-compensation adjustment, the amount of data that must be buffered may be up to the number of clock cycles of skew that may accumulate along the bus. The overall delay in transmitting data from one end of a bus to the other is the sum of the maximum skew of each of the individual node-to-node skew values along the data path. An example of this type of bus is the FB-DIMM (fully-buffered DIMM) which is the subject of a JEDEC standard.

A bus may also be operated as a multi-drop bus where the data is transmitted from a sending end (such as a memory controller) and received at a target memory module: for example the 3rd memory module along a linear bus. The module may be a dual-in-line memory module (DIMM), as is known in the art, and the maximum total skew may be equal to that of the specific bus line having the longest transmission delay. The transmission delays result from differences in trace lengths for the individual data lines, and the differences in trace lengths may include the traces on a mother board as well as the traces on the circuit card containing the memory module. The total skew may limit the length of the bus or the signaling speed.

As described in U.S. application Ser. No. 11/405,083, the effect of skew between the lines of a bus operating, for example, in a serial point-to-point manner, or in a branching manner, may be mitigated by suitably exchanging the logical assignment of the data lanes to specific bus lines, depending on the amount of skew experienced in each bus line between communicating nodes, such that, at the node at the intended receiving end of the bus, the skew is minimized, known, or controlled. As such, the amount of correction needed for skew compensation at the receiving node where the data is to be acted upon may be reduced, with a concomitant reduction in device complexity and power consumption.

SUMMARY

An interconnection system is disclosed, including a first node and a second node in communication with the first node. A first clock is provided to the first node and the second node; and, a second clock is generated with reference to the first clock, having an first integral relationship to the first clock, and having a time delay offset with respect to the first clock adjusted such that the transmission time of bits between an output the first node and an output of the second node is maintained substantially constant.

A data transmission system is disclosed, the system including at least two modules connectable by a data bus. A module has a transmitter for transmitting serial data, and a receiver for receiving serial data. The module is supplied with a signal from a common clock, and has a clock generator producing an internal clock on the each module that is derived from the common clock. A clock data recovery circuit produces a received data clock that maintains synchronism with the bits of the serial data signal, and an alignment buffer is operable to establish and maintain synchronism between the bits of the serial data and the internal clock. A switch is operable to route the received serial data to one of an external port or an internal port. The module may have a plurality of external and internal ports.

In another aspect, a memory system includes a plurality of modules, connected by links, and at least one module has a data memory. A system clock is distributed to at least two modules, and a data clock rate of data being transmitted between modules is integrally related to the system clock. A buffer on a module is operable to maintain synchronism between a bit position of a received data character and a previously established bit position.

In yet another aspect, a data interface includes a clock data recovery circuit; a clock phase alignment buffer, and a data transmission circuit. The clock data recovery circuit recovers a clock having a same frequency as the clock used in the data transmission circuit, and the phase alignment circuit compensates for a change in a time-of-arrival of the data.

In still another aspect, a memory module has a data receiver; a clock data recovery circuit, a routing switch, a memory interface, and a data transmitter. The clock data recovery circuit recovers a clock having the same frequency as a clock used in the data transmission circuit, and the phase alignment buffer circuit compensates for a time-of-arrival of the data.

In yet another aspect, a node of an interconnection system includes a data receiving circuit; a data transmitting circuit; a switch connecting the data receiving and the data transmitting circuits. A circuit is operable to maintain a sampling time in a fixed relationship to a first bit of a character of a received character having a plurality of bits; and an input data buffer is configured to resample the first bit so that an overall time delay measured between the resampled bit and a corresponding bit transmitted by another module is maintained substantially constant.

A method of transmitting data between modules is disclosed, the method comprising providing at least two modules, the modules including a receiver, a transmitter, a clock data recovery circuit, a phase alignment buffer, and a routing switch. The modules are connectable by lines. A character of a frame of data is assigned to a first line. The first line at the receiving end thereof is initialized so that a first bit of a character is sampled so as to maintain the alignment of alignment of the sampling of the first bit of the character when a time delay between the transmitted character and the receipt of the character changes.

In yet another aspect, a method of managing an interconnection system is described, where the system includes a plurality of nodes in communication with each other. The method includes transmitting a character of data comprising a plurality of bits from a first node to a second node; receiving the character at a second node; recovering a clock from the received data and aligning a sampling time to a first bit of the character; and, re-sampling the sampled data at a submultiple of the clock frequency and adjusting the phase or time delay of the re-sampling clock so that the overall time delay between the transmitted data and the resampled data is substantially constant.

DETAILED DESCRIPTION

Figure 1:
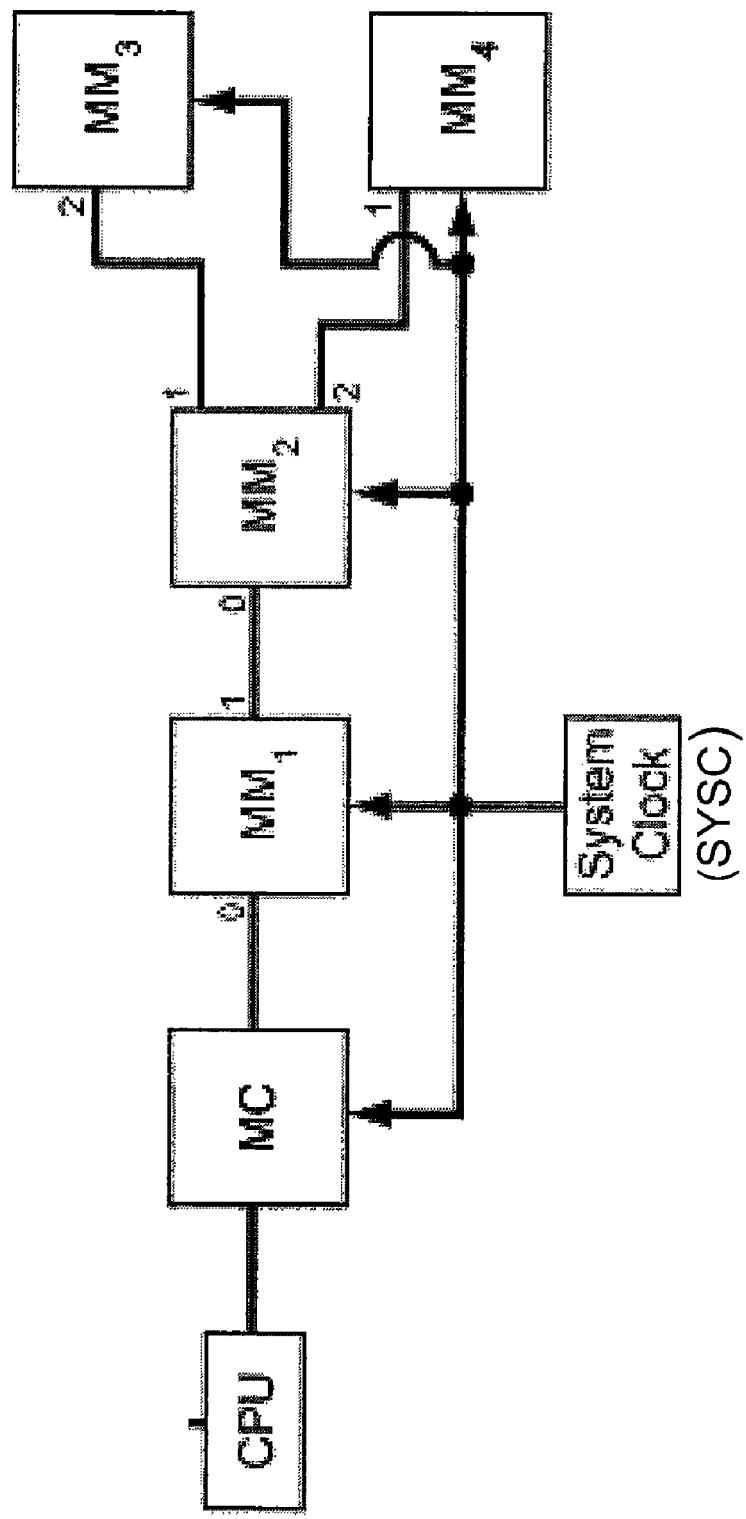
FIG. 1. is a block diagram of a computer system having memory modules.

Exemplary embodiments may be better understood with reference to the drawings, but these examples are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

It will be appreciated by a person of skill in the art that the methods described and the apparatus shown in the figures may be configured or embodied in machine-executable instructions, e.g., software, or in hardware, or in a combination of both. The instructions can be used to cause a digital processor, or the like, that is programmed with the instructions to perform the operations described. Alternatively, the operations might be performed by specific hardware components that contain hardwired logic or firmware instructions for performing the operations described, or by any combination of programmed computer components and custom hardware components, which may include analog circuits. As examples, a microprocessor, a field programmable gate array (FPGA) or an application specific integrated circuit (ASIC) may be used. Such circuits may have integral or associated memory to store any necessary instructions or data.

The methods may be provided, at least in part, as a computer program product that may include a machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions or data for execution by a computing machine or special-purpose hardware and that cause the machine or special purpose hardware to perform any one of the methodologies or functions of the present invention. The term "machine-readable medium" shall accordingly be taken to include, but not be limited to, solid-state memories, optical and magnetic disks, magnetic memories, optical memories, and carrier wave signals. The term carrier wave signals is understood to encompass the electronics and instructions needed to generate or receive electrical signals having instructions or data imposed thereon, whether such signals are conducted or radiated.

For example, but not by way of limitation, a machine readable medium may include read-only memory (ROM); random access memory (RAM) of all types (e.g., SRAM, DRAM); programmable read only memory (PROM); electronically alterable read only memory (EPROM); magnetic random access memory; magnetic disk storage media; flash memory; and, transmission using electrical, optical, acoustical or other forms of signals.

Furthermore, it is common in the art to speak of software, in one form or another (e.g., program, procedure, process, application, module, algorithm or logic), as taking an action or causing a result. Such expressions are merely a convenient way of saying that execution of the software by a computer or equivalent device causes the processor of the computer or an equivalent device to perform an action or a produce a result, as is well known by persons skilled in the art.

When describing a particular example, the example may include a particular feature, structure, or characteristic, but every example may not necessarily include the particular feature, structure or characteristic. This should not be taken as a suggestion or implication that portions of the features, structure, or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

In the interest of clarity, not all the routine features of the implementations disclosed herein are described. It will of course be appreciated that in the development of any such actual implementation, numerous implementation-specific decisions must be made to achieve a developers' specific goals, such as compliance with system and business related constraints, and that these goals will vary from one implementation to another. Moreover, it will be appreciated that such a development effort might be complex and time-consuming, but would nevertheless be a routine undertaking of engineering for those of ordinary skill in the art, having the benefit of this disclosure.

A connector or connector interface as described herein, such as a memory module connector interface, is not limited to physically separable interfaces where a male connector or interface engages a female connector or interface. A connector interface also includes any type of physical interface or connection, such as an interface where leads, solder balls or connections from a memory circuit are electrically connected to another memory circuit or a circuit board. For example, in a stacked die approach, a number of integrated circuit die (e.g., memory devices, buffer devices, or the like) may be stacked on top of one another with a substrate forming a base and an interface to a memory module, memory controller, or processor through a ball grid array or other type of connector interface. As another example, the memory devices and buffer device may be interconnected via a flexible tape interconnect and interface to a memory controller through one of a ball grid array type connector interface or a physically separable socket type connector interface. Connection types may include the interface between integrated circuit chips, interconnection conductors on a substrate, between substrates, or on printed circuit boards, or the like.

Although the examples are described in terms of memory modules in a computer system, nothing herein is intended to limit scope of the disclosure to such a localized system. The apparatus and techniques described herein may be used for a data communication system where the modules are physically separated, and where data transmission techniques using wireless technologies, or the like, may be used in whole or in part. Similarly, a plurality of memory modules may be fabricated or assembled on a common substrate, including the interconnections therebetween. The choice of physical embodiment depends on engineering and economic consideration at the time a product is designed.

FIGS. 1 and 2 are provided to identify some of the symbology and terminology which may be used in the examples which are described. This is done for convenience, clarity, consistency and conciseness, and a person skilled in the art will recognize that a variety of equivalent terminology may be used. However, for the purpose of the description provided herein, the terms set forth here will be used, except when specifically stated. This is not meant to exclude or distinguish from equivalent accepted terminology, or terminology which may come into use in the future which describe equivalent concepts.

FIG. 1 shows an example of a system including a central processing unit (CPU), a memory controller (MC), and memory module (MM) and a system clock (SYSC). Other aspects of the computer such as external interfaces, mass storage, displays, power supplies, and the like, which may also be provided, are not shown. In addition to cache memory, disk storage memory, tape memory and other forms of storage, which are not shown in FIG. 1, the system may have volatile and non-volatile memory such as RAM and FLASH attached for rapid access to program instructions and data to be used or manipulated by the programs. This memory may be connected to the CPU by a memory controller MC and include a plurality of memory modules MM.

The memory modules may be connected to each other and the memory controller by a plurality of electrical connections, printed wiring connections, or lines, which are often collectively called a bus, line, or channel. In this example, some memory modules MM are shown as being serially connected, such as MM1 to MM2 and some MM being connected in a branching arrangement, such as MM2 to MM3 and MM4.

In a mesosynchronous system, a system clock (SYSC) is distributed to modules (for example, MM) in a domain so that a plurality of modules of a group of modules may have access to a clock source of a common frequency. Various clock frequencies may be derived from SYSC which may be multiples or submultiples of the SYSC clock frequency. As such, the clocks throughout the system of a particular multiple or submultiple of the SYSC clock frequency have the same frequency, but may differ in time or phase offset from each other. This offset may be described in fractions of the clock period, or as a phase offset, where 0, 90, 180, 270 degrees of phase correspond to 0.0, 0.25, 0.5, and 0.75 of the clock period. The offset may vary slowly with time due to temperature or circuit aging. Slowly will be understood to mean that a multiplicity of characters may be transmitted before a sufficient change in offset occurs that may need a change in a compensation or alignment.

Since the overall clocking rate of the data is the same, or related to the same clock, over a plurality of modules, padding characters may not be needed to compensate for differences between clocks on different modules. Similarly the use of synchronization characters on a frame-by-frame basis can be avoided. In another aspect, since the clocking rate is the same at the plurality of modules, gaps in the data transmission or preambles may be avoided.

Data may be manipulated and computations may be performed using the various clocks for timing of operations, and it is known that operations may be performed, for example, on the rising edge of a clock signal, or on both the rising and falling edges of the clock signal. The latter type of operation is usually called double-data-rate (DDR) clocking. For simplicity of presentation, the present discussion is in terms of a rising-edge clock operation, as a person of skill in the art will understand the application to a system where double-data-rate clocking, or the like, is performed. Other clocking schemes are known and may be used.

FIG. 2 serves to define the conventions used in the description of the connections, or bus, between two devices, which may be, for example, two memory modules MM. Data may be said to flow in an upstream or downstream direction, where upstream is conventionally defined as being towards the end of a channel having a management interface, such as a memory controller MC or a CPU, and downstream is the opposite direction. A bus may be reconfigurable so that an upstream direction becomes a downstream direction. Other terms such as northbound and southbound may be used.

A bus, link, or channel connects the two devices for the purposes of high speed data, address and command transmission. While there are many configurations of channels, typically the channel may have a group of lines, which may use unipolar, bipolar, or differential signaling technology. The lines may be unidirectional or bi-directional. In this example, a differential line is used, which may include a pair of traces on a motherboard, terminated at a memory module in a differential signaling electronic circuit, as is known in the art. (The electrically differential line is shown as a single line in the drawings.) At present, this type of connection is being used for high-speed interfaces in contemporary product design, but any type of connection may be used, including optical or wireless techniques, and the like.

Figure 2A:
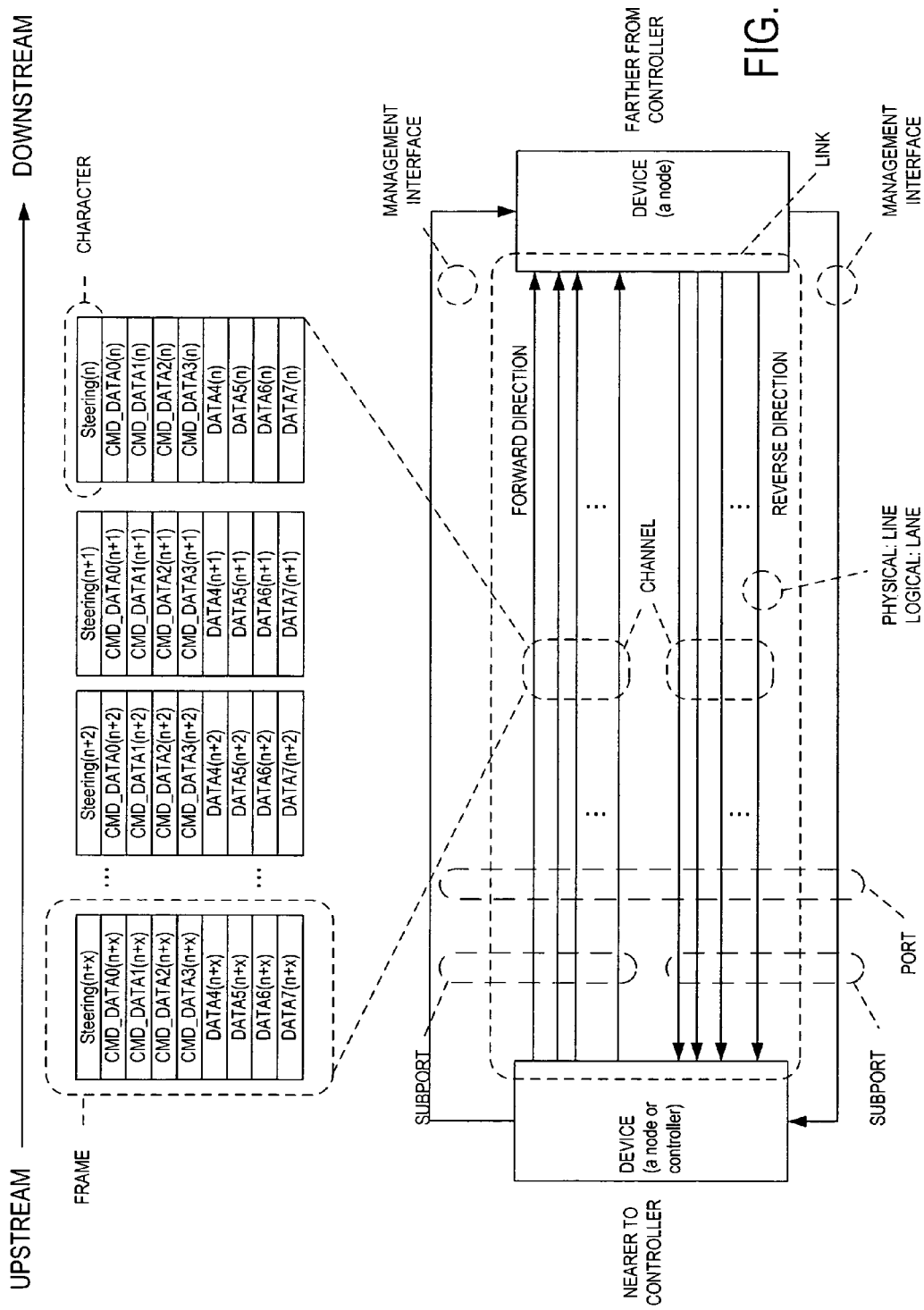
FIGS. 2 (a) and (b) illustrate naming conventions for logical and physical aspects of the examples.

In an aspect, the channel may have a unidirectional group of lines. In the present example, ten unidirectional lines are provided of which nine may be in use at any time, and the tenth line may be a spare. Other numbers of lines and spares may be used. A spare line is not required. Data may be transmitted over the channel in the form of characters which may be of a fixed length in clock cycles, and a data bit of the character may be associated with a clock cycle. In this example, a 20 bit character length is used, associated with 20 clock cycles. The characters on a plurality of lines may be grouped into logical clusters and called frames. That is, as shown in FIG. 2a, a character on each of the active lines may be associated with a character on another line that is being transmitted contemporaneously with the other character(s). However, the characters on individual lines need not be bit-synchronized with each other in time, and may be offset from each other in time by one or more bit periods, and the clock offset may include fractional bit periods.

The transmission of data between a first module and a second module may be controlled at the transmitting module and the receiving module can accept the data at the mesosynchronous clock data rate.

A similar channel may exist in the reverse direction. In this discussion, the direction of signal propagation will be described as in the downstream direction; however, it will be appreciated that signal propagation in the upstream direction will have similar characteristics.

The passage of a character from an upstream device, such as a MC or MM to a downstream device, such as a MM may be termed a hop. In this discussion, for clarity, the transmission of data is between two memory modules MM, without loss of generality. The term line or lines is usually used when describing the physical nature of the connection between two modules in a hop, and these lines may be associated with, for example, traces on a printed circuit board, ancillary components such as connectors, and the sending and receiving end interface electronics. The term lane is usually used to represent the logical assignment of data of a character in a frame. Each of the lanes may be assigned (or "bound") to a line by operation of the MC, MM or the like, and this binding may change from hop-to-hop, and may change with time. In this discussion, the binding is considered to be static once the system is configured, but may be different at each module. That is, the association of a lane with a line in each hop is established at a prior time of system configuration, and remains in the assigned state for the duration of operation, or until a reconfiguration is performed. Lanes may be bound to different lines in different hops so as to manage, and perhaps to reduce or minimize, the skew between the arrival time of characters in a frame at a destination module.

A channel or link between two modules may be considered to exist when the modules have been initialized, and been trained, and where lanes have been bound to lines and a process of frame alignment has been completed. This process may be called configuration.

A group of lines exiting from a module in the downstream direction connecting with another module by a hop is called an output sub-port and the entry of such lines into the another module is through an input sub-port. Another similar group of lines, configured as sub-ports, may exist in the upstream direction, and the combination of the output and input sub-ports associated with the hop between two modules may be termed a port.

A character in a data frame may include steering data, and this generally means the addressing information needed to route the data in a frame, which may be the present frame or another frame on another line or a subsequent frame on the present line, to a destination module. This may be steering data such as is described in U.S. Ser. No. 11/405,083. Other means of providing addressing or routing of the data are known by persons of skill in the art and may be used. The same lane or a plurality of lanes, which may not include the steering lane, may contain characters for commands, addresses, or data.

Figure 2B:
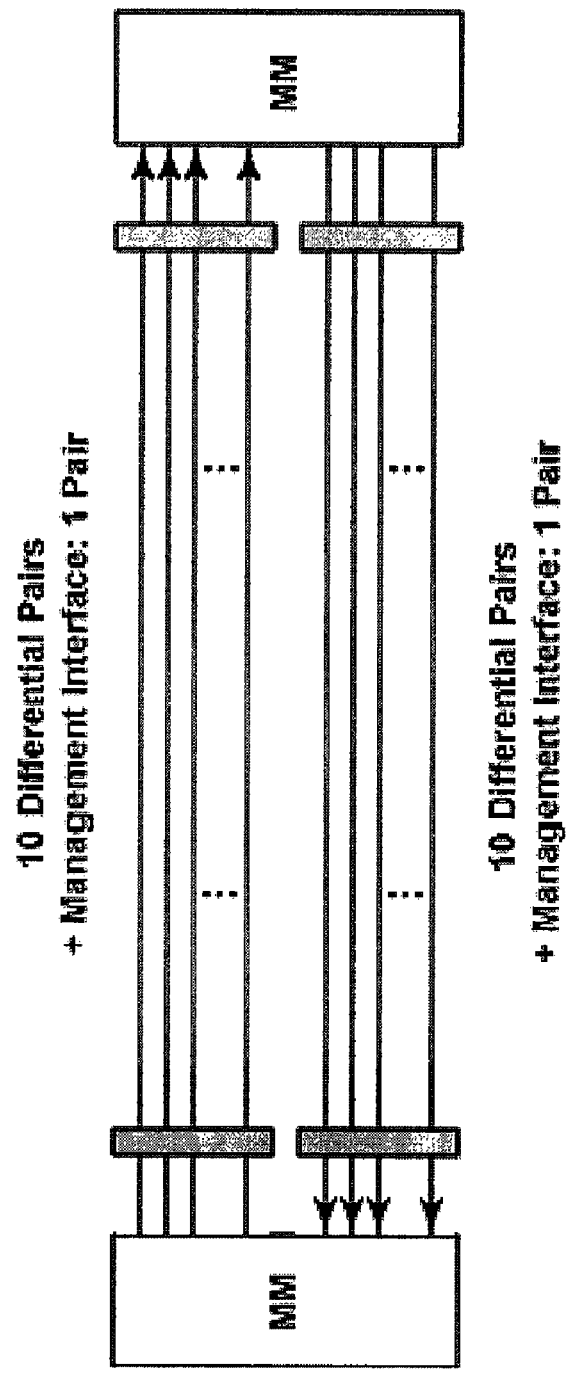

FIG. 2b is an example of the physical interface between two modules, which may be memory modules MM. Pairs of traces on a motherboard may connect between connectors on the mother board. Single or multiple connectors may be used so that the MM may plug into a motherboard and connect to printed circuit wiring. Other connections such as, for example, power, power management, clock and test may also be present, but are not shown.

Figure 3:
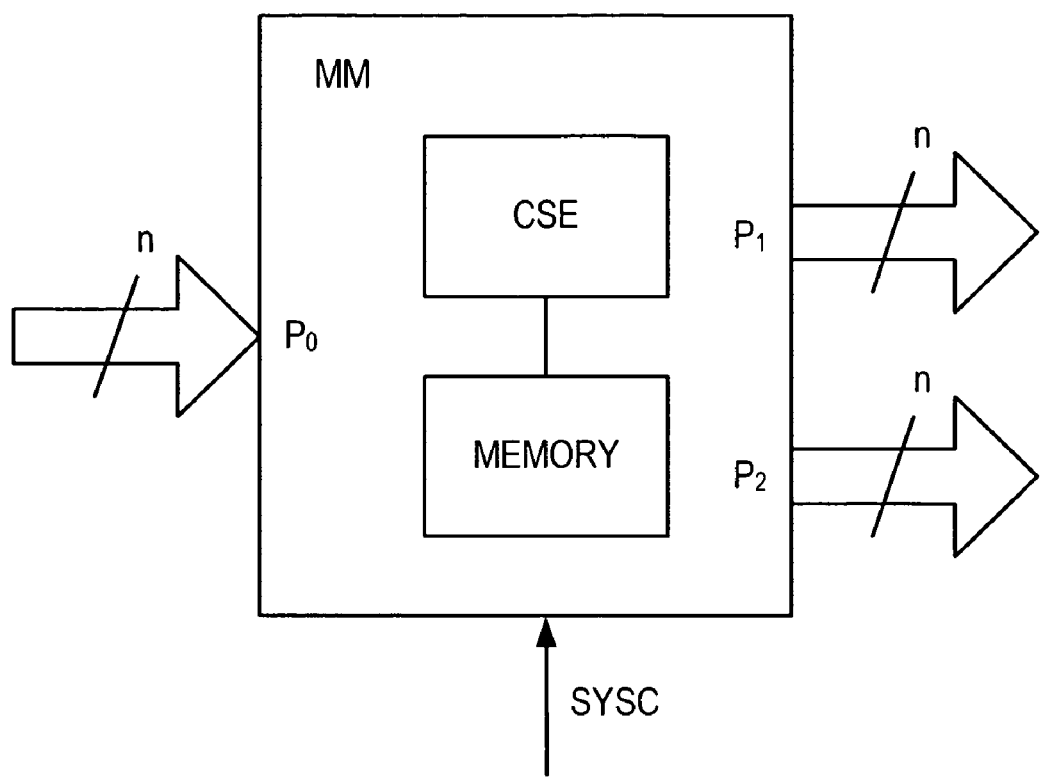
FIG. 3 is a simplified block diagram of a memory module.

FIG. 3 shows a simplified block diagram of a memory module, showing only the downstream path. An input port $P_0$ has n data lines, in this example 10. In the case of a module for incorporation in a binary tree, there may be two output ports $P_1$ and $P_2$ each also having 10 data lines. The input data at port $P_0$ is routed to one of the memory in the MM or to port $P_1$ or port $P_2$, depending on the information provided in the steering data, or by other routing methods.

Associated with the MM may be a memory, which may be integral to the MM or in communication with the MM, and which may be any of the types of data memory that have been previously mentioned. The memory may be replaced or supplemented by an interface to other computer or communications equipment, or other external device, so that a memory address may, for example, result in the input or output of data from the MM to a display, network interface, or the like.

Figure 4:
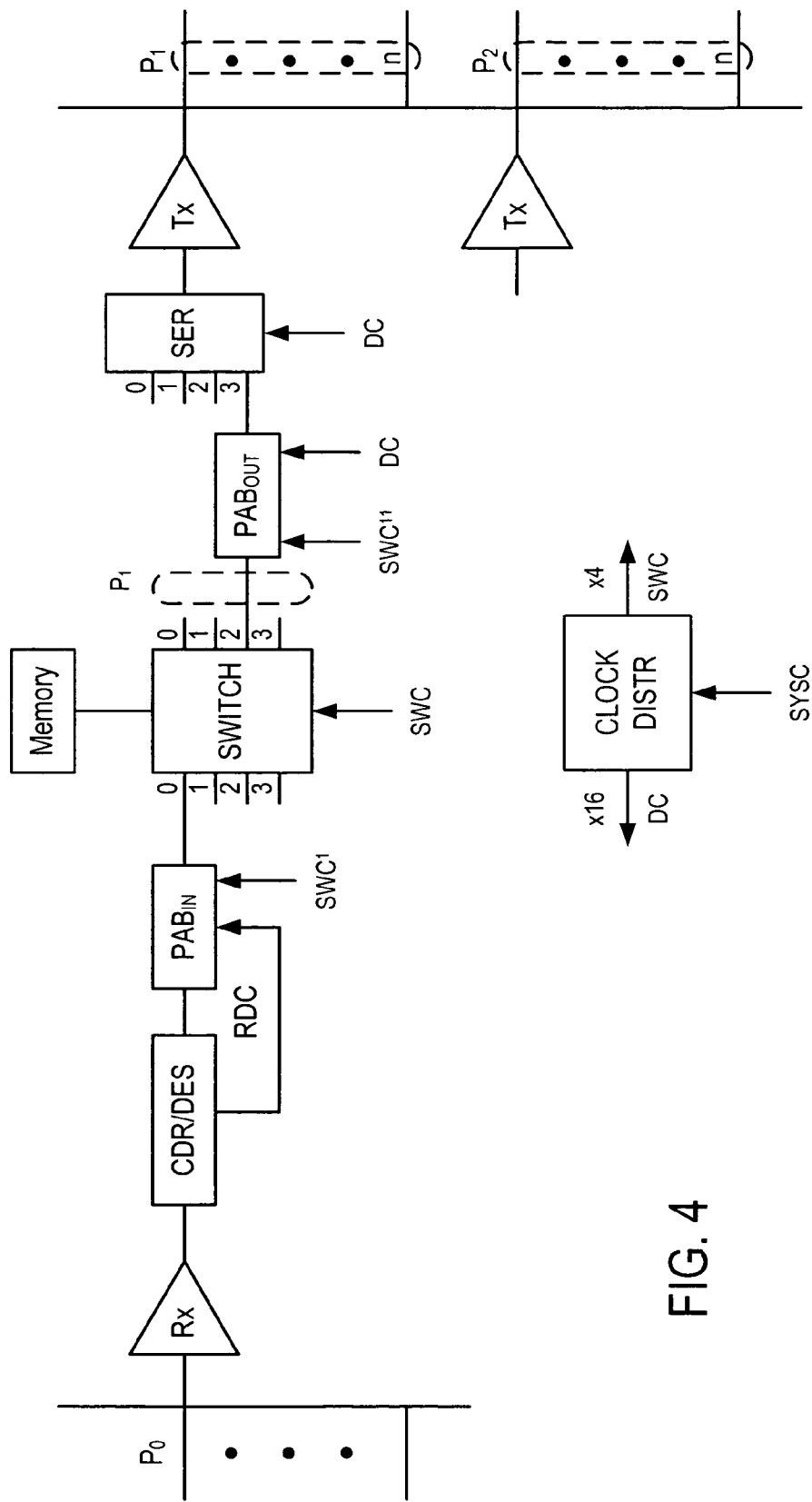
FIG. 4 is a more detailed block diagram of the memory module of FIG. 3.

The device performing the routing and other related functions may be called a configurable switching element (CSE). FIG. 4 shows portions of the CSE. In this example, the MM circuits may operate at several different clock rates. Multiple clock rates may facilitate the electronic implementation of the system; however, providing that sufficiently fast electronic components can be obtained, all of the operations of the CSE may be performed at a common clock speed, and that clock speed may be that of the bus data rate. The system clock SYSC may be distributed from a common clock (SYSC) to each of the modules for which the system clock SYSC is used. The system clock (SYSC) rate may be other than the bit clock rate of the serial bit data on the lines of a hop, and clock-rate multipliers or dividers, as are known in the art, may be used at the modules, or elsewhere, so as to derive local clocks. The serial bit rate clock may be a multiple, m, or a submultiple of the system clock SYSC, and portions of the MM may operate at another clock rate: for example; a switch clock rate (SWC). In this example, the data rate clock rate DC is 16 times the SYSC, and a switch clock rate (SWC) is 4 times the SYSC. Other clock frequencies may also be used in the module. Some of the clocks used may not be integrally related to the SYSC.

One of the lines connecting modules MM is discussed as being representative of the process used on the other lines. The input line at port $P_0$ may be received by, or interfaced to, an analog circuit that may provide impedance matching, which may include explicit or intrinsic bandwidth filtering, and which may convert the differential signal on the line into an electrical signal suitable for further data processing or manipulation. As mentioned, this discussion presumes that the module has previously been configured with respect to the remainder of the system, including the alignment of clocks or determination of clock phase offsets; as such, the configuration process, error detection, error recovery, and the like, are not discussed in any detail.

As shown in FIG. 4, an output signal from the receiver circuit (RX) is processed by a clock data recovery (CDR) circuit. A deserializer (DES) may be used to convert the data from a serial format to a plurality of data streams so that the data may be processed in parallel at a lower clock rate SWC, such as may be used in the switch circuitry (SW). The CDR circuit may be one of a number of circuit types known in the art as a DLL (delay locked loop), or a PLL (phase locked loop), or the like, so as to establish a recovered data clock (RDC) having a fixed relationship with respect to a bit position in the data being received. The recovered data clock RDC may be used to sample the signal on the line at a point in time of the received bit where the data signal is valid. That is, the time of sampling of the received data signal is aligned so that the data sample is not taken on the boundary between bits, and where the effects of distortions that may have occurred in transmission on the hop are a minimum. The RDC may also be aligned with a character boundary at the time of initialization.

The recovered data-rate-clock (RDC) may be offset from a locally generated data clock (DC) by a phase offset (or at least a fractional bit time) that is due to the different propagation paths taken by the clock signal SYSC from the common system clock to different modules, differential time delays in the modules, and by the differing signal propagation delays for different lines between adjacent modules.

The difference in propagation delay time between modules may be termed a skew, and the skew may have both fixed and variable components. The additional propagation time differential delays experienced by each path on the module is also relevant and, when skew is described, the total differential time delay is meant, unless specifically otherwise characterized. For example, the propagation time between modules may include the propagation time of the signals along the traces on the mother board, which may at a speed greater than about half the velocity of light, and the propagation delays in the filters of the transmitter TX of the previous module and the receiver RX of the present module and in digital buffers, or the like. Practical analog electronic circuits have finite bandwidths, and such circuits operating near a bandwidth limit may result in additional propagation delay in processing signals.

The propagation delay may be thought of as either a phase delay or a time delay. Analog circuits may have time delays of the order of a clock period, and the delay may be a function of the component values, which may be temperature dependent. Some ageing may occur, but this is generally on a long time scale. So, therefore, the phase or time relationship between the incoming first bit of a character and a corresponding module clock edge may not be known a priori. Where a time scale for the variation of skew or propagation in a fixed circuit configuration is described, a long time is understood to mean that the time scale of the variation is greater than a small multiple of the character duration at the clock rate.

An alignment of the clocks and the data may be made during a configuration process, and may use training characters to establish a relationship between a character or frame boundary, the signal valid window, and the RDC, for each line. Once established, the relationship is maintained by the DLL or the PLL, and the RDC may also used to clock a deserializer (DES). The DLL or PLL may be updated by the CDR circuit so that the sampling point is maintained with a valid data window, even if the propagation time delay of the hop changes, for example, due to environmental factors (usually temperature). That is, the association between the specific clock bit in the recovered data clock (RDC) at a module for a line and the 0th bit of the character remains unchanged even when the time delay on the hop varies. As this variation is slow compared with the frame or character rate, and the DDL or PLL may not be continuously updated. Depending on the system design, if data is not continuously transmitted on line of a hop, a periodic synchronization transmission may be initiated to adjust the RDC to maintain the association.

Figure 5:
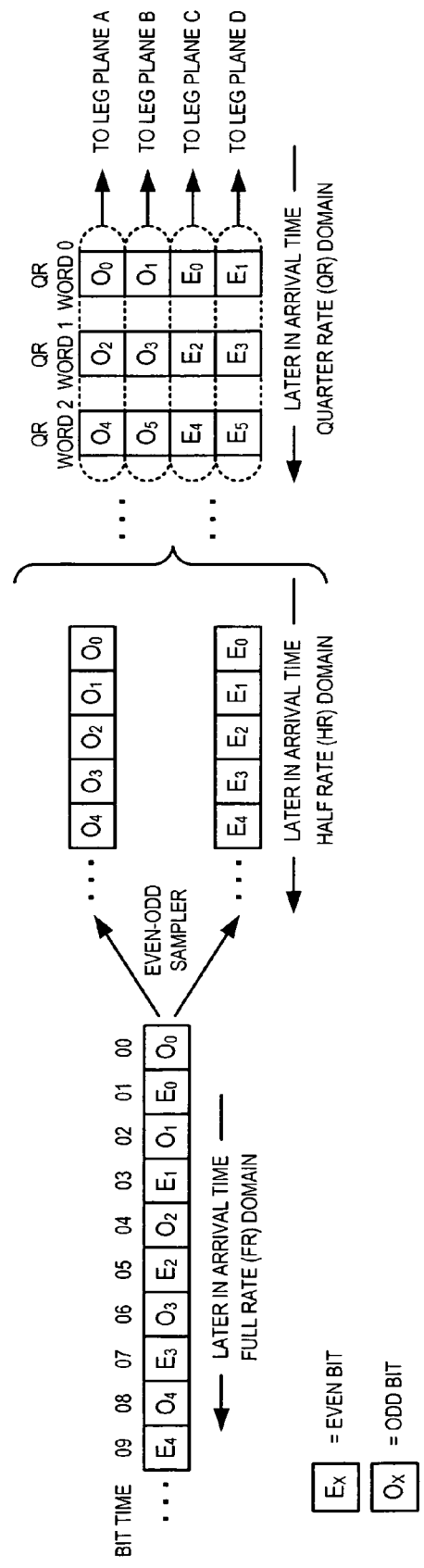
FIG. 5 shows an example of the logical arrangement of data bits at the input and the output of a deserializer circuit.

An example of the conversion of a serial data stream, which may represent the bits of character on a line to a plurality of parallel data streams which may be processed locally at a lower data rate, is shown in FIG. 5. The character (20 bits in this example) is processed by the deserializer (DES) at the recovered data clock rate (RDC) and routed within the module at clock rates of one half and one quarter of the line data rate. A logical association of the individual data bit positions with planes in the switch logic is shown, where each plane is operated at the switch clock rate (SWC). Other logical assignments of the data to the lower-clock-rate portions of the processing are equally possible. In this example, the data of a character is not completely deserialized. That is, four internal data paths (planes A-D) are used, and the data is not completely transformed into a parallel data character. Equally, providing that the logic is sufficiently fast, the character may be processed as a fully serial data character, without serializing or deserializing.

It will be appreciated that, if the time duration of the bits were shown, rather than a logical representation, the time duration or interval between successive bits of the data in the half-rate domain would be twice that of the incoming data, and the duration of the data bits in the quarter-rate domain would be four times that of the incoming data. In this example, the data are shown as the even and odd bits of the incoming character, however this notation is merely for convenience in description and is not intended to restrict the manner in which the data bits are routed within the module.

A phase alignment buffer (PAB) is used to align the output of the deserializer (DES) with the internal switch clock (SWC). The switch rate clock is shown as being distributed from the switch SW as $SWC^1$ and $SWC^{11}$ to connote that the SWC used for the PABs at the input and the output of the switch have clock rates that are both the same frequency as that of the SWC, but may each have a different but substantially fixed phase or time offset from the SWC used in the switch (SW) itself.

In an aspect, the bit length of the PAB may be less than a character, and when a routing scheme described in U.S. Ser. No. 11/405,083 is used, the routing information may be obtained before a complete character is received by the receiving module. The PAB length may be less than 18 bits and may be 5 bits in length.

In this example, the character is deserialized into four packets of five data bits, and the clock rate SWC is one fourth of the DC. The PAB may act so that the $0^{th}$ bit of the input character is aligned with a leading edge of the SWC. Subsequent bits of the deserialized data of the character (the 1st, 2nd and 3rd) may be aligned with relative phases of the SWC (90, 180 and 270°), respectively. Subsequent bits of the character, which follow in time may be processed similarly.

The packet may be processed by the switch (SW) so as to route the packet to a memory, or to one of the output ports $P_1$, $P_2$. This routing may be dynamic, based on a received steering data character. In addition, the switch (SW) may perform a lane exchange by, for example, transferring an input character on line 1 of $P_0$, to an output line 3 on $P_1$. The logical lane to physical line association may be static in nature, and the process may be called "binding". In this manner, an input character may be routed along a path to a memory location, or to another module, and the assignment of lanes to lines may be used, for example, to manage the differential skew between characters of a frame at the destination module. The term spare line is used to designate any line connecting two ports that is not presently bound to a lane.

An interface between the switch (SW) and an on-module memory may be similar to a module-to-module interface, and provide for the reception of characters in a packet that are intended to be to or from the local memory. This reception may include deskewing the characters within a frame and transferring the frame to the memory. Such local data recovery is described in patent application U.S. Ser. No. 11/405, 083.

After processing in the switch (SW), where the data has been routed to an output port (for example, $P_1$ or $P_2$), the packets of the character are output as the input to an output phase alignment buffer PAB. The output PAB serves to maintain the alignment of the $0^{th}$ bit of a character with the clock edge of the data clock DC at the output serializer SER that was established during the configuration process. Since the processing in the switch (SW) is a generally synchronous process, the skew between the switch clock (SWC) and the data clock (DC) tends to remain relatively static, once established. That is, the propagation delay time of a bit through the switch is substantially constant. However, the phase or relative time of the data input to the switch (SW) may differ for each line, with respect to the data clock (DC). Output PABs may be used to align the bits of the character on a line with the appropriate clock cycle of the data clock (DC) for the line. This alignment is performed on a line-by-line basis, and the characters of a frame need not be resynchronized at each hop as they are processed separately.

The serializer then merges the bits of the packets of the character into a character having the same timing as a previously transmitted character on the line. That is, the association of bit 0 of the $n^{th}$ following character with a clock edge of the data clock DC delayed by 20n clock cycles from the $0^{th}$ bit of the previous character is maintained, where n is a positive integer. Thus, the timing of the characters is maintained even when there is no actual character being transmitted. The output of the serializer (SER) may be converted to a differential analog data signal in the TX circuit for transmission on the next hop.

The other characters on the other lines in the frame are treated similarly. However, each of the lines has a separate CDR circuit, and the RDC for each line may have different phases with respect to each other and with respect to the SWC. The variation of the phase on each line may also have a different dependence on time or temperature, corresponding to the circuit details, such as line length, amplifier or filter characteristics, or the like.

Figure 6:
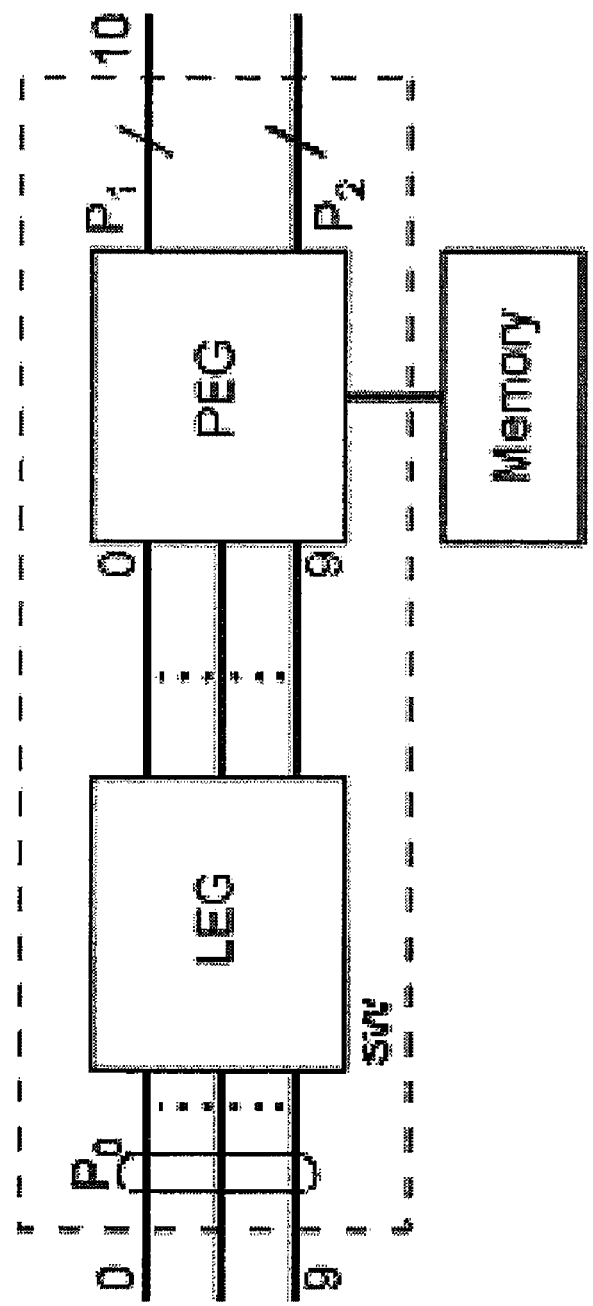
FIG. 6 illustrates an arrangement of functional elements in a switch of a memory module.

FIG. 6 shows a simplified functional block diagram of the switch (SW). The switch may be formed of two switches, a lane-exchange grid (LEG) and a port-exchange grid (PEG). As shown, there is only one LEG, however one or more LEG elements may be also provided at the switch output, or LEG at the input or output may be omitted, depending on the specific design. Here, the input lines (0-9) are associated with lanes (for example, A-J) where, such that, for example, lane A is associated with line 0 at the input. The routing may be to output port $P_1$, for example, where lane A may be associated with, for example, line 3 at the output. The binding, switching, or routing a character from an input line to an output line and port may be performed by the LEG and the PEG, respectively. The binding of remaining lines B-J to output lines 1-9 may be determined when the system is configured, so that each lane in the input frame is routed to a particular physical line at the output. Lane A may be bound to another line as well. Binding may differ from port-to-port on a module, and may differ as between one module and another.

The result of this process may be to maintain the association of a bit (for example the $0^{th}$ bit) of a character transmitted by a memory controller MC to a same clock edge of the data clock DC, where the data clock is the data clock DC at any of the modules, even when the time delay of the transmission of data over the hops changes with time.

Figure 7A:
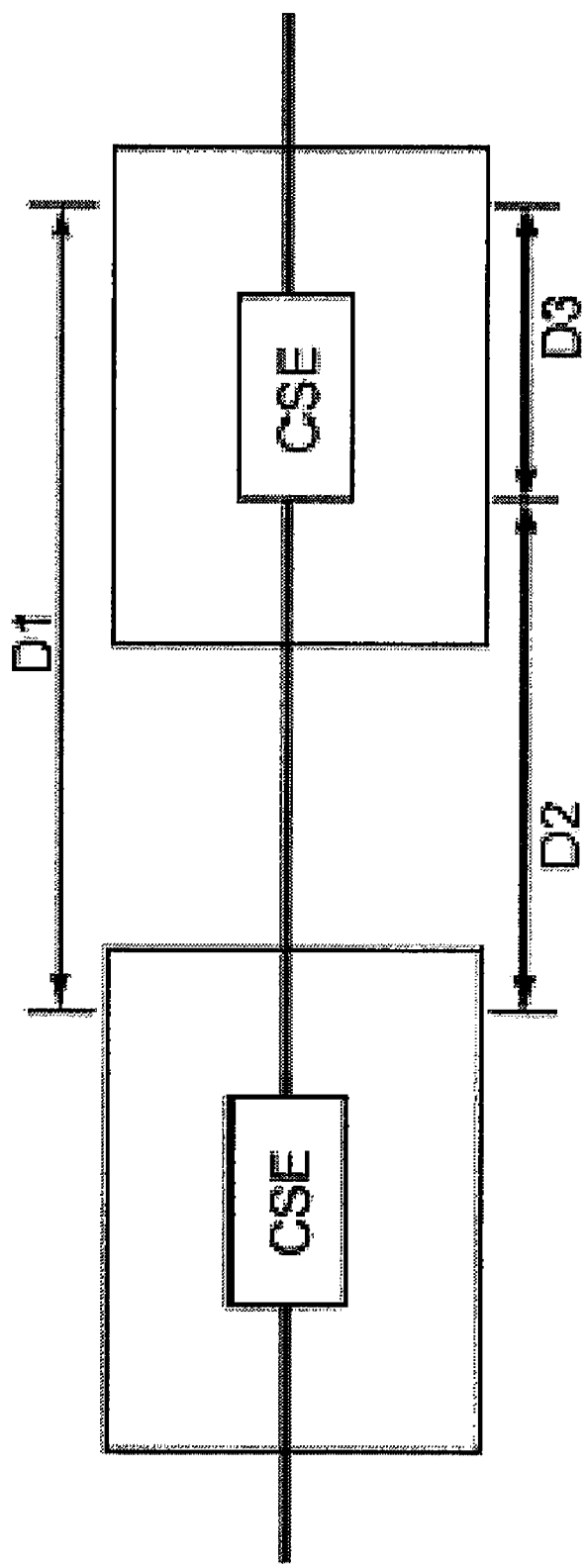
FIGS. 7 (a) and (b) show the timing regimes associated with mesosynchronous operation.
Figure 7B:
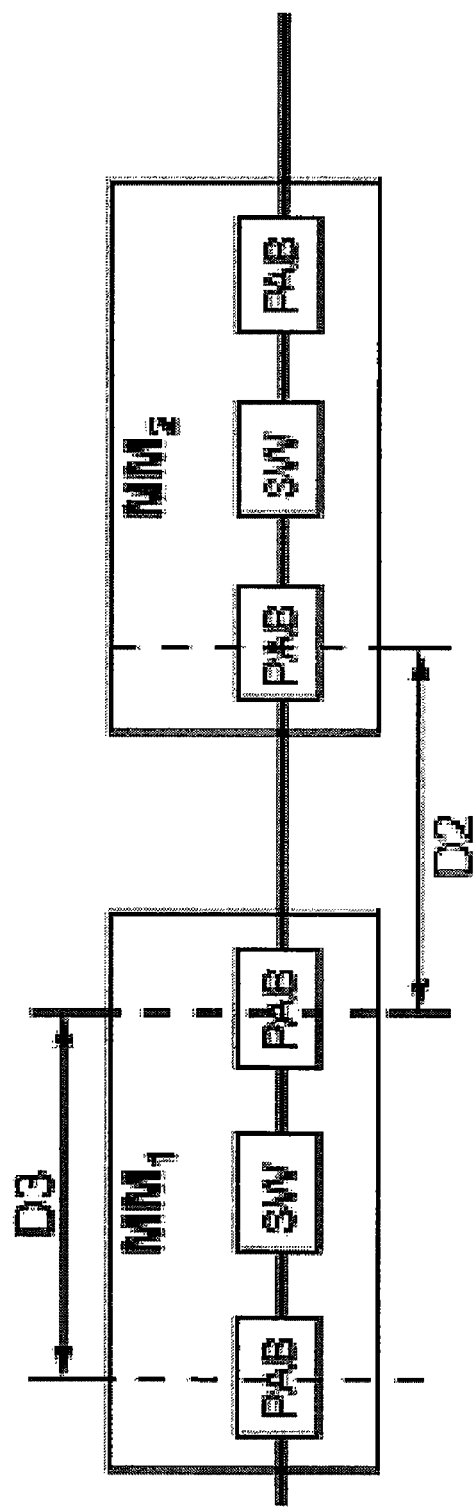

This concept is shown in FIGS. 7A-B. In FIG. 7A, the propagation delay time $D_1$ represents the propagation delay time between the output of module $MM_1$ and the output of module $MM_2$. Maintaining this time a constant for each lane of data results in the established correspondence between a first bit of a character transmitted on a line and the clock edge of the DC being maintained the same as existed at the completion of the configuration process. The delay $D_1$ may be considered to be a sum of the delays $D_2$ and $D_3$, where $D_2$ may be the delay not associated with the switch (SW) and $D_3$ is the delay associated with the switch (SW). Each of the delays $D_2$ and $D_3$ may vary with environment factors over time, however the effect of the changes in delay are compensated by the phase alignment buffer (PAB) so that the overall transmission time delay is substantially constant. This is shown in more detail in FIG. 7B. Substantially constant is understood to mean that the circuits are adjusted so that, after synchronization, the overall transmission time of the first bit of a character does not change by more than a bit duration, without resynchronization.

In the previous discussion, the time delay of the system clock (SYSC) at a module with respect to the clock edge at the SYSC clock source, which may not be on a module, has been tacitly assumed to be constant. This time delay may also vary with environmental factors or ageing, however, since the phase alignment buffers (PAB) on each module compensate for the relative time delay between the DC and the SWC and the RDC, the variations of SYSC clock delay may also be compensated.

The result of the arrangement described is that a full character or more may not need to be buffered at the input PAB of the MM in order to adjust for the change in delay of a hop. The depth of the PAB may be approximately the variation of the skew over the operating temperature range for the line in the hop, rather than, for example, the total variation of skew over all of the lines of the hop. At the time of configuration, the data may be positioned at a suitable point in the buffer for transfer between clock speed domains so that the data bit position is maintained in the buffer during the transfer period.

A result of the phase alignment buffer is that the overall time delay through the memory module may be optimized, taking account of the changes in the skew due to environmental factors. When the data is propagated over a path with multiple hops, the overall time delay between the MC and the destination module may be reduced, when compared with an approach which recovers the data of a frame at an intermediate module and performs deskewing by adding delays along the data path. A delay may be added to one or more of the lines at a source or destination module in order to deal with the remaining skew, or may be added during configuration so as to optimize the overall skew.

Since the association, which may be termed synchronization, of the data clock DC with the data of any line is maintained after the association has been established, and is maintained locally at a module pair, the data transmission on each line does not have to be continuous except when required for system bandwidth or latency performance reasons. When the lines are not needed, power can be removed from the transmitter and receiver components, as well as perhaps from portions of the CDR and other circuitry. As data is typically routed from an input port to either the local memory or one of the two output ports, at least one of the output ports may be shut down when not needed.

One of the lines in a group of lines of the sub-port may be maintained in an active state for purposes of signaling, such as alerting the remaining lines to a data frame in a previously inactive link, or to data being sent for refresh purposes. However, a signal presence indicator may also be used, so that the presence on data on a line will activate the receiver and associated circuitry. Thus, in steady-state operation, a line may be either active or inactive, and when the data line is active, data, where data may be steering data, a command (including addressing), data being stored or read, or a clock maintenance transmission, is being transmitted.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention.

What is claimed is:

1. An interconnection system, comprising:
a first node;
a second node in communication with the first node, wherein the first and the second node communicate over a bus;
a first clock, the clock being provided to the first node and the second node; and
a second clock, having a first integral relationship to the first clock,
wherein a character comprised of bits is transmitted between the first node and the second node serially at a clock rate having a second integral relationship to the first clock, the second clock having a time delay with respect to the first clock such that the transmission time of bits between an output of the first node and an output of the second node is maintained substantially constant.

2. The system of claim 1, wherein the first and the second integral relationship are the same integral relationship.

3. The system of claim 1, wherein a received character is converted from a serial data format to a plurality of streams of data having a serial data format at a lower clock speed than that of the second clock.

4. The system of claim 3, wherein the time delay of the second clock is adjusted so that a same bit location of a subsequently received character is converted to a same relative bit location in the serial data streams.

5. The system of claim 3, wherein each of the plurality of serial data streams is routed to one of a memory or another node.

6. The system of claim 5, wherein the routing is determined by a received character.

7. The system of claim 5, wherein when the character is routed to another node, and the data is re-serialized using the second clock.

8. The system of claim 7, wherein the re-serialized data is transmitted on one of a plurality of lines connecting two nodes.

9. The system of claim 8, wherein the re-serialized data is bound to a selected one of the plurality of lines.

10. The system of claim 1, wherein the time delay of a lane is adjusted so that the overall time delay of the lane, when measured between the output of the first node and the output of the second node, is substantially constant.

11. The system of claim 10, wherein a received character on one of a plurality of lanes of is converted from a first serial data format to a plurality of second serial data streams independently of a received character on another of the plurality of lanes.

12. The system of claim 11, wherein the number of second serial data packets is equal to the number of bits in the character.

13. A node of an interconnection system, comprising:
a data receiving circuit;
a data transmitting circuit;
a switch connecting the data receiving and the data transmitting circuit;
a circuit operable to maintain a sampling time in a fixed relationship to a first bit of a character of a received character having a plurality of bits; and
an input data buffer configured to resample the first bit so that an overall time delay measured between the resampled bit and a corresponding resampled bit at another module is maintained substantially constant.

14. The node of claim 13, wherein the circuit is a data clock recovery circuit.

15. The node of claim 13, wherein the input data buffer operates at a clock frequency that is an integral submultiple of a data clock rate.

16. The node of claim 13, wherein the switch is operable to route the received character to at least one of another node or a memory.

17. The node of claim 13, wherein the switch output is transmitted at a data clock rate.

18. The node of claim 13, wherein the input data buffer is operable to deserialize the received character into a plurality of data packets, and an output data buffer is operable to reserialize the switch output data into a character.

19. The node of claim 13, wherein the character is received on a first line of a plurality of lines of a first port, and the character is transmitted to another node on a selectable one of a plurality of lines of a second port.

20. A method of managing an interconnection system, the system comprising a plurality of nodes in communication with each other; the method comprising:
- transmitting a character of data comprising a plurality of bits from a first node to a second node;
- receiving the character at a second node;
- recovering a clock from the received data and aligning a sampling time of the character; and
- re-sampling the sampled data at a submultiple of the clock frequency and adjusting the phase or time delay of the re-sampling clock so that the overall time delay between the transmitted character from the first node and a character on the same lane transmitted by the second node is substantially constant.

* * * * *

UNITED STATES PATENT AND TRADEMARK OFFICE
CERTIFICATE OF CORRECTION

| | | |
|---|---|---|
| PATENT NO. | : 8,112,655 B2 | |
| APPLICATION NO. | : 12/245349 | |
| DATED | : February 7, 2012 | |
| INVENTOR(S) | : Kevin D. Drucker et al. | |

It is certified that error appears in the above-identified patent and that said Letters Patent is hereby corrected as shown below:

<u>In the Claims</u>

In column 14, claim 11, line 35, before "is converted from a first serial" delete "of".

Signed and Sealed this
Twenty-fourth Day of April, 2012

David J. Kappos
*Director of the United States Patent and Trademark Office*